United States Patent
Lin et al.

(10) Patent No.: US 8,300,449 B2
(45) Date of Patent: Oct. 30, 2012

(54) RESISTIVE RANDOM ACCESS MEMORY AND VERIFYING METHOD THEREOF

(75) Inventors: Chih-He Lin, Beigang Township, Yunlin County (TW); Shyh-Shyuan Sheu, Zhubei (TW); Wen-Pin Lin, Dacun Township, Changhua County (TW); Pei-Chia Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 204 days.

(21) Appl. No.: 12/955,657

(22) Filed: Nov. 29, 2010

(65) Prior Publication Data
US 2012/0075908 A1 Mar. 29, 2012

(30) Foreign Application Priority Data
Sep. 23, 2010 (TW) ................................ 99132237 A

(51) Int. Cl.
*G11C 11/00* (2006.01)
(52) U.S. Cl. .................. 365/148; 365/185.2; 365/158; 365/185.18
(58) Field of Classification Search .................. 365/148, 365/185.18, 185.19, 185.2, 158
See application file for complete search history.

(56) References Cited

U.S. PATENT DOCUMENTS

| | | | |
|---|---|---|---|
| 6,781,906 B2 * | 8/2004 | Perner et al. | 365/209 |
| 7,151,689 B2 * | 12/2006 | Baker | 365/148 |
| 7,289,351 B1 | 10/2007 | Chen et al. | |
| 7,599,219 B2 | 10/2009 | Kim et al. | |

OTHER PUBLICATIONS

Tanaka, T., et al.; "High-speed Programming and Program-Verify Methods Suitable for Low-Voltage Flash Memories;" Symposium on VLSI Circuits Digest of Technical Papers; 1994; pp. 61-62.
Chung, C.C., et al.; "A Multilevel Sensing and Program Verifying Scheme for Bi-NAND Flash Memories;" IEEE; 2005; pp. 267-270.
Lee, K.J., et al.; "A 90 nm 1.8 V 512 Mb Diode-Switch PRAM With 266 MB/s Read Throughput;" IEEE Journal of Solid-State Circuits; vol. 43; No. 1; Jan. 2008; pp. 150-162.
Bedeschi, F., et al.; "A Bipolar-Selected Phase Change Memory Featuring Multi-Level Cell Storage;" IEEE Journal of Solid-State Circuits; vol. 44; No. 1; Jan. 2009; pp. 217-227.

* cited by examiner

*Primary Examiner* — Son Dinh
(74) *Attorney, Agent, or Firm* — Thomas|Kayden

(57) ABSTRACT

A resistive random access memory (RRAM) and a verifying method thereof are provided. The RRAM comprises at least one resistive memory cell. The resistive memory cell comprises a resistive memory element and a transistor, wherein one terminal of the resistive memory element is coupled to a first terminal of the transistor. The verifying method comprises the following steps: Whether the resistive memory cell passes verification is determined. During a first time period and under the circumstance that the resistive memory cell fails to pass verification, a reference voltage is applied to the other terminal of the resistive memory element and a voltage pulse is applied to a second terminal of the transistor according to a voltage signal to write a reverse voltage to the resistive memory cell.

10 Claims, 5 Drawing Sheets

RESISTIVE RANDOM ACCESS MEMORY AND VERIFYING METHOD THEREOF

This application claims the benefit of Taiwan application Serial No. 99132237, filed Sep. 23, 2010, the subject matter of which is incorporated herein by reference.

BACKGROUND OF THE APPLICATION

1. Technical Field

The disclosure relates in general to a memory, and more particularly to a resistive random access memory (RRAM) and a verifying method thereof.

2. Description of the Related Art

Along with the booming of portable products and the advance in functions, the worldwide demand for the memory grows rapidly, particularly, the rapid grow of non-volatile memory. In response to such change in the industry, leading manufacturers are dedicated to the development of the technology for the next generation memory, hoping that they can take the lead in the industry.

Among various types of non-volatile memory, the resistive random access memory (RRAM) attracts a lot of attention because the RRAM has many commercially beneficial features in contrast to other competitive solid state memory technology.

SUMMARY OF THE DISCLOSURE

The disclosure is directed to a resistive random access memory (RRAM) and a verifying method thereof. By writing at least one reverse voltage to the resistive memory cell, the RRAM and the verifying method thereof increase the yield rate for the RRAM.

According to a first aspect of the present disclosure, a resistive random access memory (RRAM) is provided. The RRAM comprises a resistive memory cell, a digital-to-analog converter, a decision logic and a selection circuit. The resistive memory cell comprises a resistive memory element and a transistor, wherein one terminal of the resistive memory element is coupled to a first terminal of the transistor. The decision logic is used for controlling the digital-to-analog converter to output a writing voltage to the resistive memory cell. During a first time period and under the circumstance that the resistive memory cell fails to pass verification, the selection circuit applies a reference voltage to the other terminal of the resistive memory element and applies a voltage pulse to a second terminal of the transistor to write a reverse voltage.

According to a second aspect of the present disclosure, a verifying method thereof is provided. The RRAM comprises at least one resistive memory cell. The resistive memory cell comprises a resistive memory element and a transistor, wherein one terminal of the resistive memory element is coupled to a first terminal of the transistor. The verifying method comprises the following steps: Whether the resistive memory cell passes verification is determined. During a first time period and under the circumstance that the resistive memory cell fails to pass verification, a reference voltage is applied to the other terminal of the resistive memory element and a voltage pulse is applied to a second terminal of the transistor according to a voltage signal to write a reverse voltage to the resistive memory cell.

The above and other aspects of the disclosure will become better understood with regard to the following detailed description of the exemplary but non-limiting embodiment (s). The following description is made with reference to the accompanying drawings.

DETAILED DESCRIPTION OF THE DISCLOSURE

The following embodiments disclose a resistive random access memory (RRAM) and a verifying method thereof. By writing at least one reverse voltage to the resistive memory cell, the RRAM and the verifying method thereof increase the yield rate for the RRAM. The RRAM comprises a resistive memory cell, a digital-to-analog converter, a decision logic and a selection circuit. The resistive memory cell comprises a resistive memory element and a transistor, wherein one terminal of the resistive memory element is coupled to a first terminal of the transistor. The decision logic is used for controlling the digital-to-analog converter to output a writing voltage to the resistive memory cell. During a first time period and under the circumstance that the resistive memory cell fails to pass verification, the selection circuit applies a reference voltage to the other terminal of the resistive memory element and applies a voltage pulse to a second terminal of the transistor to write a reverse voltage.

The method for verifying RRAM comprises the steps of determining whether the resistive memory cell passes verification; applying a reference voltage to the other terminal of the resistive memory element and applying a voltage pulse to a second terminal of the transistor according to a voltage signal to write a reverse voltage to the resistive memory cell during a first time period and under the circumstance that the resistive memory cell fails to pass verification.

Figure 1:
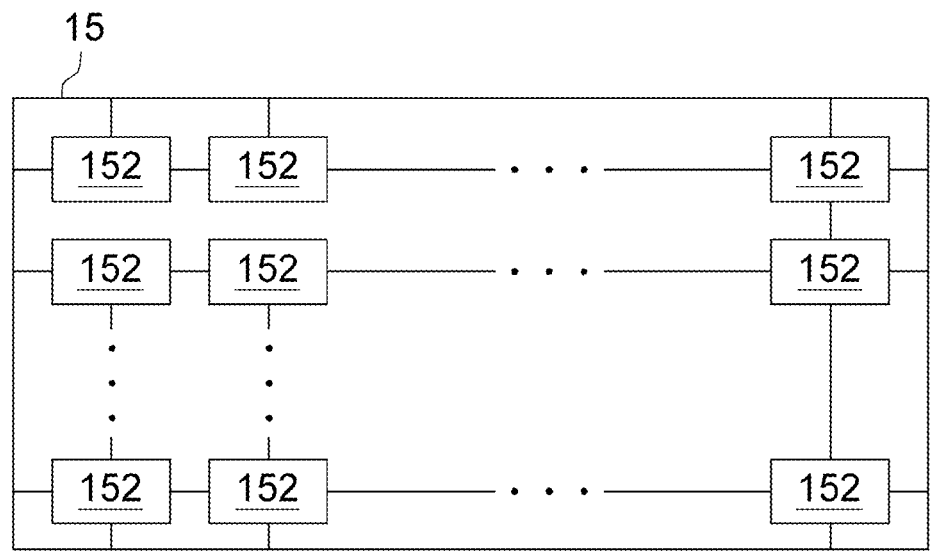
FIG. 1 shows a resistive memory cell array.
Figure 2:
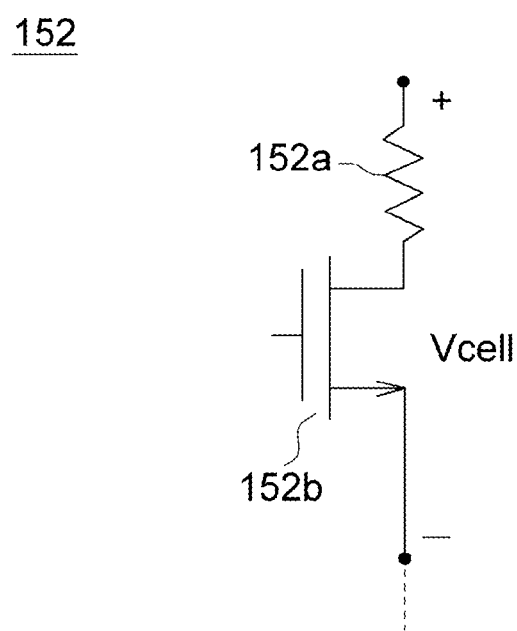
FIG. 2 shows a resistive memory cell
Figure 3:
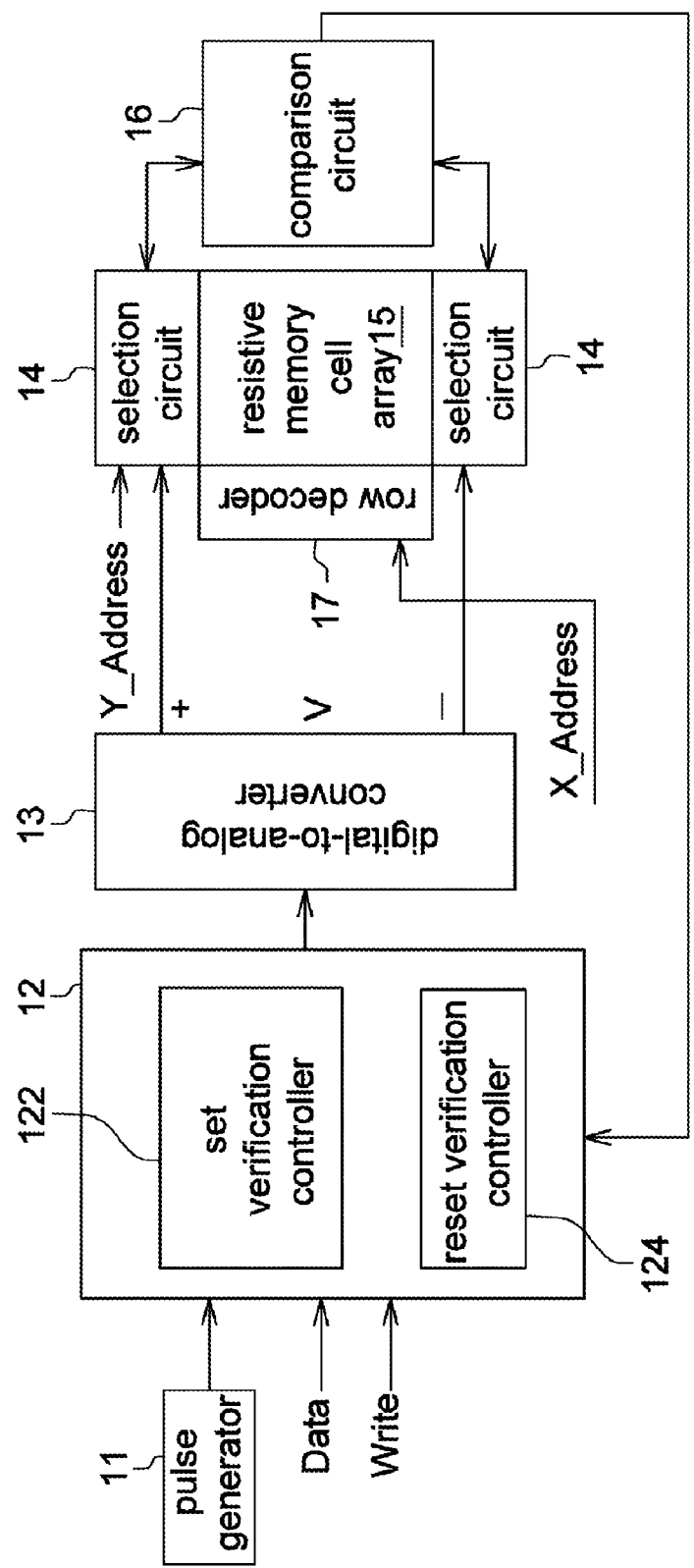
FIG. 3 shows an RRAM according to the disclosure.

Referring to FIG. 1, FIG. 2 and FIG. 3. FIG. 1 shows a resistive memory cell array. FIG. 2 shows a resistive memory cell. FIG. 3 shows an RRAM according to the disclosure. The RRAM 1 comprises a pulse generator 11, a decision logic 12, a digital-to-analog converter 13, a selection circuit 14, a resistive memory cell array 15, a comparison circuit 16 and a row decoder 17. The pulse generator 11 generates the required pulse for the decision logic 12. The decision logic 12 controls the digital-to-analog converter 13 to output a voltage signal V. The decision logic 12 comprises a set verification controller 122 and a reset verification controller 124. The set verification controller 122, in the course of set verification, controls the digital-to-analog converter 13 to output a voltage signal V. The reset verification controller 124, in the course of reset verification, controls the digital-to-analog converter 13 to output a voltage signal V.

The resistive memory cell array 15 comprises a resistive memory cell 152, which comprises a resistive memory element 152a and a transistor 152b. The gate of the transistor 152b is controlled by the row decoder 17. One terminal of the resistive memory element 152a is coupled to a first terminal of the transistor 152b, such as a drain. During a time period, the selection circuit 14, according to voltage signal V, applies a voltage pulse to a second terminal of the transistor 152b and applies a reference voltage to the other terminal of the resistive memory element 152a to write a reverse voltage to the resistive memory cell 152, wherein the second terminal of the transistor 152b is such as a source, and the reference voltage is such as a ground potential. Or, during the other time period, the selection circuit 14, according to voltage signal V, applies a voltage pulse to the other terminal of the resistive memory element 152a and applies a reference voltage to a second terminal of the transistor 152b to write a forward voltage to the resistive memory cell 152. The selection circuit 14 can be realized by several selection transistors. The comparison circuit 16 senses whether the data stored in the resistive memory cell 152 is at high logic level or low logic level.

The set verification controller 122, in the course of set verification, controls the digital-to-analog converter 13 to output a voltage signal V, so that the forward voltage progressively increases along with the progressive increase in the verification count of the resistive memory cell 152, or the reverse voltage progressively increases along with the progressive increase in the verification count of the resistive memory cell 152. The reset verification controller 124, in the course of reset verification, controls the digital-to-analog converter 13 to output a voltage signal V, so that the reverse voltage progressively increases along with the progressive increase in the verification count of the resistive memory cell 152.

First Embodiment

Figure 4:
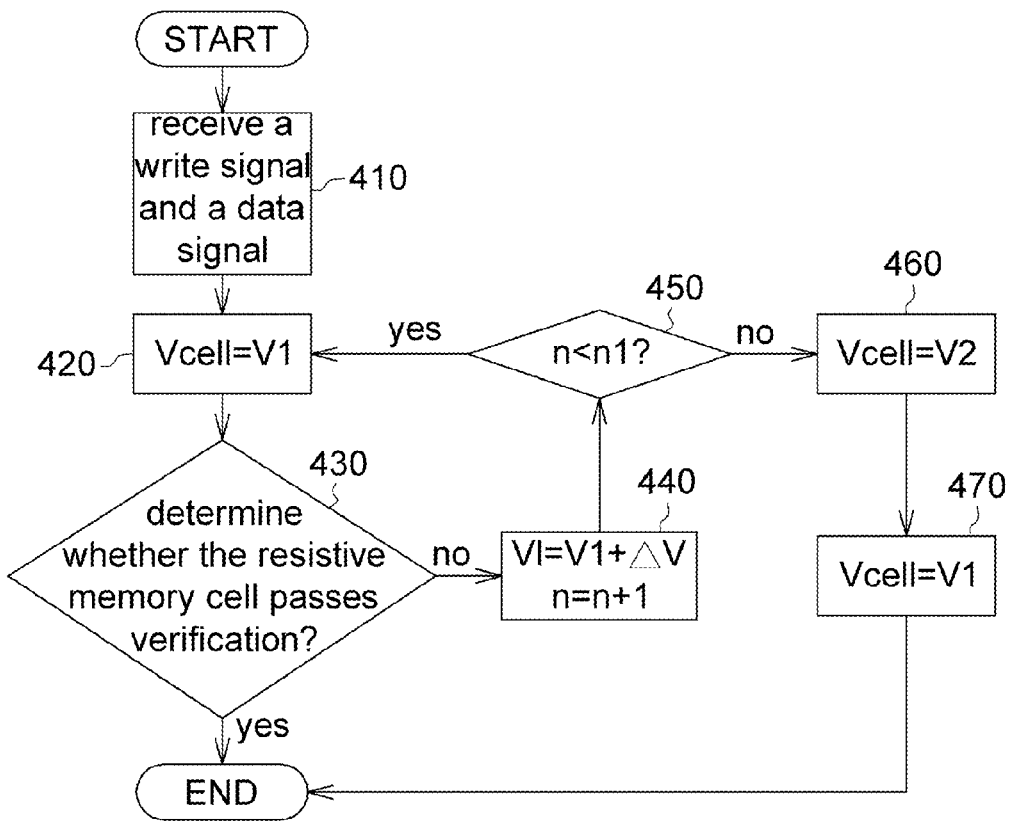
FIG. 4 shows a flowchart of a verifying method according to a first embodiment.
Figure 5:
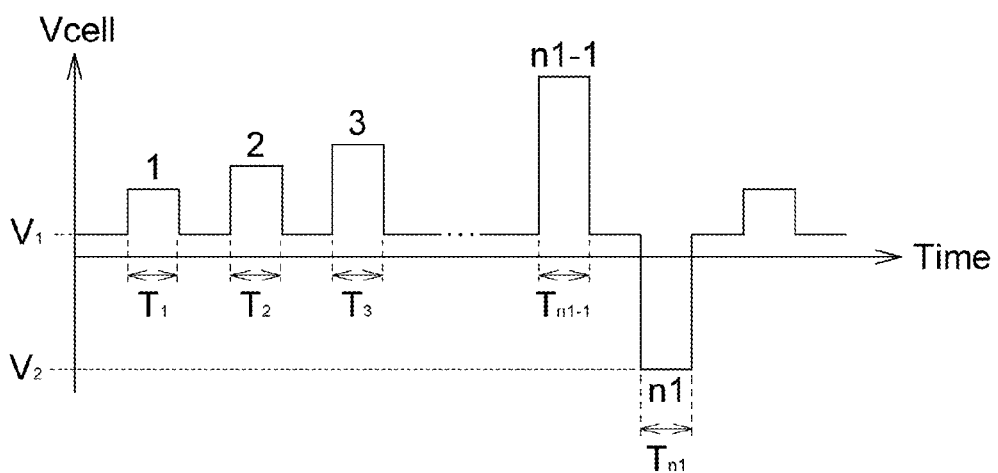
FIG. 5 shows a wave pattern of a writing voltage according to a first embodiment.

Referring to FIG. 2, FIG. 3, FIG. 4 and FIG. 5. FIG. 4 shows a flowchart of a verifying method according to a first embodiment. FIG. 5 shows a wave pattern of a writing voltage according to a first embodiment. Firstly, the method begins at step 410, a write signal Write and a data signal Data are received. If set verification is performed to the resistive memory cell 152, then the data signal is equal to 0, wherein set verification is also referred as low-configuration verification. Then, the method proceeds to step 420, the writing voltage Vcell of the resistive memory cell 152 is set as voltage V1. Then, the method proceeds to step 430, whether the resistive memory cell 152 passes verification is determined. If the resistive memory cell 152 passes verification, then the verification process terminates. To the contrary, if the resistive memory cell 152 fails to pass verification, then the method proceeds to step 440. In step 440, the verification count n and the voltage V1 are progressively increased, that is, n=n+1 and V1=V1+ΔV, wherein ΔV denotes a voltage variation. Then, the method proceeds to step 450, whether the verification count n is smaller than the predetermined number n1 is determined. If the verification count n is smaller than the predetermined number n1, then step 420 is repeated.

During a time period T1, the selection circuit 14 applies a first voltage pulse to the other terminal of the resistive memory element 152a and applies a reference voltage to a second terminal of the transistor 152b to write a forward voltage to the resistive memory cell 152. Then steps 430, 440 and 450 are repeated. Similarly, during time periods T2 to Tn1−1, the selection circuit 14 sequentially applies second to (n1−1)$^{th}$ voltage pulses to the other terminal of the resistive memory element 152a and applies a reference voltage to a second terminal of the transistor 152b to sequentially write the forward voltage which progressively increases along with the progressive increase in the verification count to the resistive memory cell 152.

The above steps 420, 430, 440 and 450 are repeated until the verification count n is not smaller than the predetermined number n1. If the verification count n is not smaller than the predetermined number n1, then the method sequentially precedes to steps 460 and 470, and after step 470, the verification process terminates. In step 460, the writing voltage Vcell of the resistive memory cell 152 is set as voltage V2, and in step 470, the writing voltage Vcell of the resistive memory cell 152 is set as voltage V1. During a time period Tn1, the selection circuit 14 applies an n1$^{th}$ voltage pulse to a second terminal of the transistor 152b and applies a reference voltage to the other terminal of the resistive memory element 152a to write a reverse voltage to the resistive memory cell 152.

Second Embodiment

Figure 6:
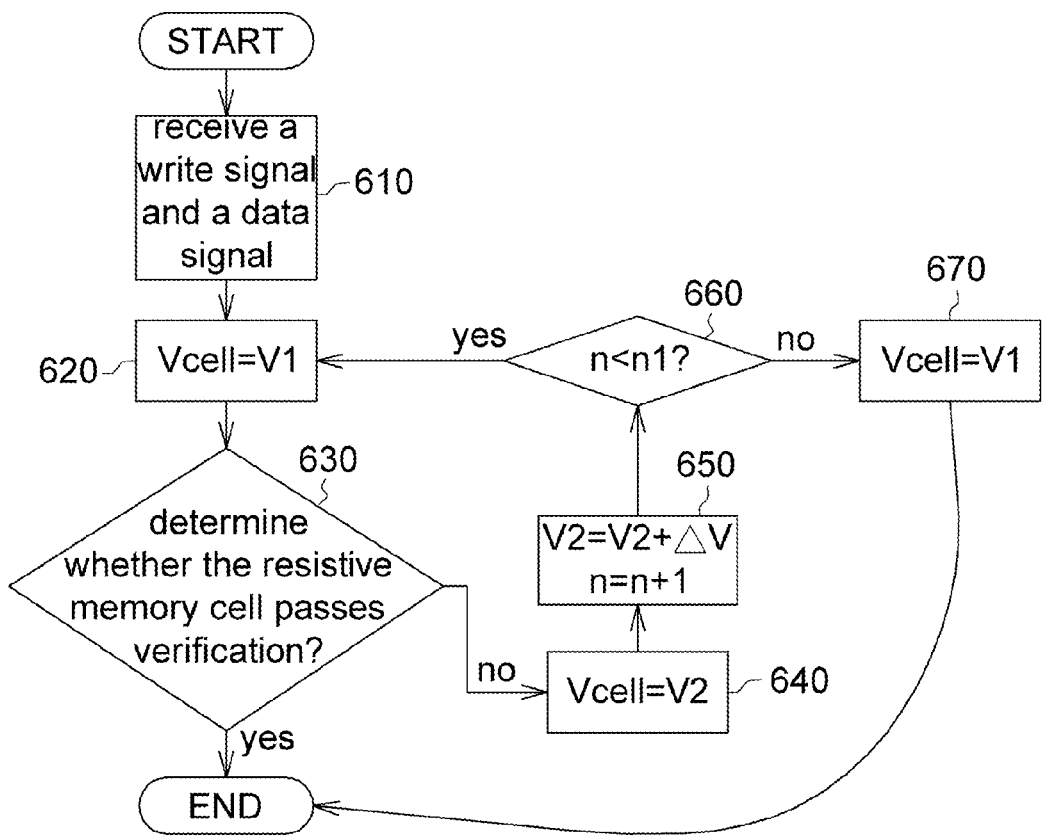
FIG. 6 shows a flowchart of a verifying method according to a second embodiment.
Figure 7:
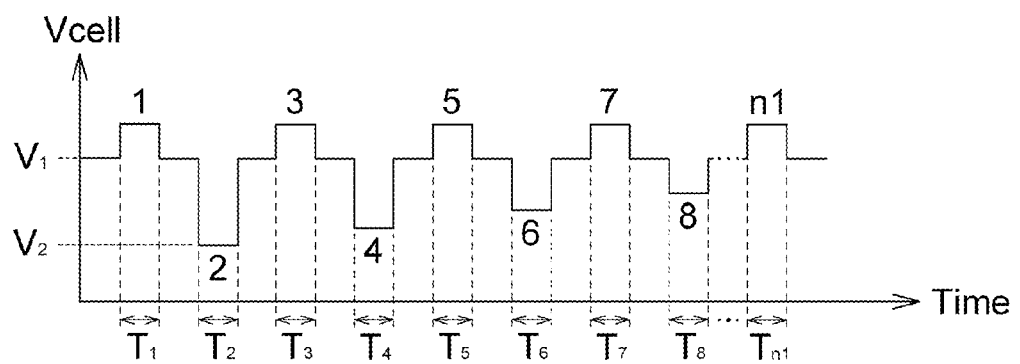
FIG. 7 shows a wave pattern of a writing voltage according to a second embodiment.

Referring to FIG. 2, FIG. 3, FIG. 6 and FIG. 7. FIG. 6 shows a flowchart of a verifying method according to a second embodiment. FIG. 7 shows a wave pattern of a writing voltage according to a second embodiment. Firstly, the method begins at step 610, a write signal Write and a data signal Data are received. If set verification is performed to the resistive memory cell 152, then the data signal is equal to 0, wherein set verification is also referred as low-configuration verification. Then, the method proceeds to step 620, the writing voltage Vcell of the resistive memory cell 152 is set as voltage V1. During a time period T1, the selection circuit 14 applies a first voltage pulse to the other terminal of the resistive memory element 152a and applies a reference voltage to a second terminal of the transistor 152b to write a forward voltage to the resistive memory cell 152.

Then, the method proceeds to step 630, whether the resistive memory cell 152 passes verification is determined. If the resistive memory cell 152 passes verification, then the verification process terminates. To the contrary, if the resistive memory cell 152 fails to pass verification, then the method proceeds to step 640. In step 640, the writing voltage Vcell of the resistive memory cell 152 is set as voltage V2. During a time period T2, the selection circuit 14 applies a second voltage pulse to a second terminal of the transistor 152b and applies a reference voltage to the other terminal of the resistive memory element 152a to write a reverse voltage to the resistive memory cell 152. Then, the method proceeds to step 650, the verification count n and the voltage V2 are progressively increased, that is, n=n+1 and V2=V2+ΔV, wherein ΔV denotes a voltage variation. Then, the method proceeds to step 660, whether the verification count n is smaller than the predetermined number n1 is determined. If the verification count n is smaller than the predetermined number n1, then step 620 is repeated. During a time period T3, the selection circuit 14 applies a third voltage pulse to the other terminal of the resistive memory element 152a and applies a reference voltage to a second terminal of the transistor 152b to write a forward voltage to the resistive memory cell 152.

Then, steps 630, 640, 650 and 660 are repeated. Similarly, during time periods T4, T6 and T8, the selection circuit 14 sequentially applies a fourth, a sixth and an eighth voltage pulse to a second terminal of the transistor 152b and applies a reference voltage to the other terminal of the resistive memory element 152a to sequentially write a reverse voltage which progressively increases along with the progressive increase in the verification count to the resistive memory cell 152. During time periods T3, T5 and T7, the selection circuit 14 sequentially applies third, fifth and seventh voltage pulses to the other terminal of the resistive memory element 152a and applies a reference voltage to a second terminal of the transistor 152b to sequentially write a forward voltage to the resistive memory cell 152. Likewise, during subsequent time periods, the forward voltage and the reverse voltage will be alternately written to the resistive memory cell 152.

The above steps 620, 630, 640, 650 and 660 are repeated until the verification count n is not smaller than the predetermined number n1. If the verification count n is not smaller than the predetermined number n1, then the method proceeds to step 670, and after step 670, the verification process terminates. In step 670, the writing voltage Vcell of the resistive memory cell 152 is set as voltage V1. During a time period Tn1, the selection circuit 14 applies an $n1^{th}$ voltage pulse to the other terminal of the resistive memory element 152a and applies a reference voltage to a second terminal of the transistor 152b to write a forward voltage to the resistive memory cell 152.

Third Embodiment

Figure 8:
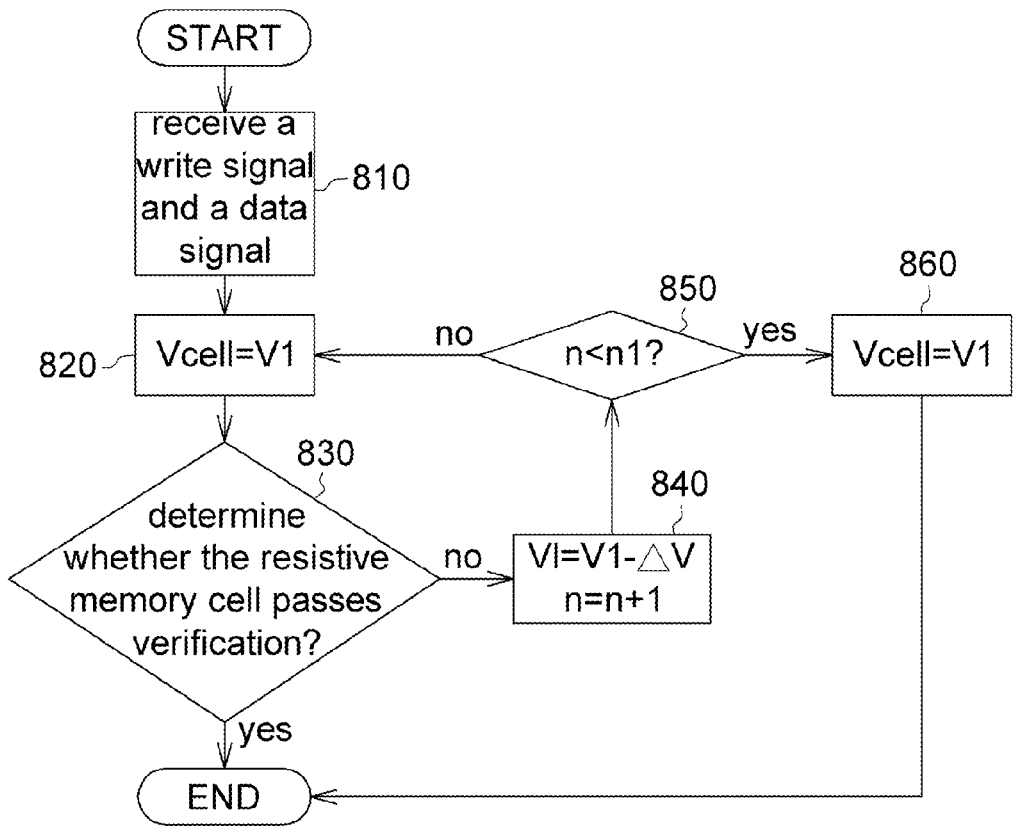
FIG. 8 shows a flowchart of a verifying method according to a third embodiment.
Figure 9:
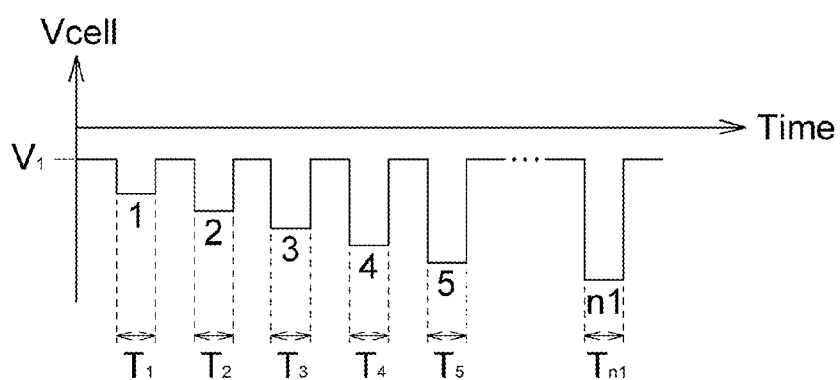
FIG. 9 shows a wave pattern of a writing voltage according to a third embodiment.

Referring to FIG. 2, FIG. 3, FIG. 8 and FIG. 9. FIG. 8 shows a flowchart of a verifying method according to a third embodiment. FIG. 9 shows a wave pattern of a writing voltage according to a third embodiment. Firstly, the method begins at step 810, a write signal Write and a data signal Data are received. If reset verification is performed to the resistive memory cell 152, then the data signal is equal to 1, wherein reset verification is also referred as high-configuration verification. Then, the method proceeds to step 820, the writing voltage Vcell of the resistive memory cell 152 is set as voltage V1. Then, the method proceeds to step 830, whether the resistive memory cell 152 passes verification is determined. If the resistive memory cell 152 passes verification, then the verification process terminates. To the contrary, if the resistive memory cell 152 fails to pass verification, then the method proceeds to step 840. In step 840, the verification count n and the voltage V1 are progressively decreased, that is, n=n+1 and V1=V1−ΔV, wherein ΔV denotes a voltage variation. Then, the method proceeds to step 850, whether the verification count n is smaller than the predetermined number n1 is determined. If the verification count n is smaller than the predetermined number n1, then step 820 is repeated.

During a time period T1, the selection circuit 14 applies a first voltage pulse to a second terminal of the transistor 152b and applies a reference voltage to the other terminal of the resistive memory element 152a to write a reverse voltage to the resistive memory cell 152. Then, steps 830, 840 and 850 are repeated. Similarly, during time periods T2~Tn1, the selection circuit 14 sequentially applies a second to the $n1^{th}$ voltage pulse to a second terminal of the transistor 152b and applies a reference voltage to the other terminal of the resistive memory element 152a to sequentially write a reverse voltage which progressively decreases along with the progressive increase in the verification count to the resistive memory cell 152.

The above steps 820, 830, 840 and 850 are repeated until the verification count n is not smaller than the predetermined number n1. If the verification count n is not smaller than the predetermined number n1, then the method sequentially proceeds to step 860, and after step 860, the verification process terminates. In step 860, the writing voltage Vcell of the resistive memory cell 152 is set as voltage V1.

While the disclosure has been described by way of example and in terms of the exemplary embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for verifying a resistive random access memory (RRAM), wherein the RRAM comprises at least one resistive memory cell, which comprises a resistive memory element and a transistor, one terminal of the resistive memory element is coupled to a first terminal of the transistor, and the verifying method comprises:
    determining whether the resistive memory cell passes verification; and
    applying a reference voltage to the other terminal of the resistive memory element and applying a voltage pulse to a second terminal of the transistor according to a voltage signal to write a reverse voltage to the resistive memory cell during a first time period and under the circumstance that the resistive memory cell fails to pass verification.

2. The verifying method according to claim 1, further comprises:
    progressively increasing the reverse voltage along with the progressive increase in a verification count of the resistive memory cell.

3. The verifying method according to claim 1, further comprises:
    progressively decreasing the reverse voltage along with the progressive increase in a verification count of the resistive memory cell.

4. The verifying method according to claim 1, further comprises:
    applying the voltage pulse to the other terminal of the resistive memory element and applying the reference voltage to a second terminal of the transistor to write a forward voltage to the resistive memory cell according to the voltage signal during a second time period different from the first time period and under the circumstance that the resistive memory cell fails to pass verification.

5. The verifying method according to claim 4, further comprising:
    progressively increasing the forward voltage along with the progressive increase in a verification count of the resistive memory cell.

6. An resistive random access memory (RRAM), comprising:
    at least one resistive memory cell, comprising:
        a resistive memory element; and
        a transistor, wherein one terminal of the resistive memory element is coupled to a first terminal of the transistor;
    a digital-to-analog converter;
    a decision logic used for controlling the digital-to-analog converter to output a voltage signal;
    a selection circuit used for applying a reference voltage to the other terminal of the resistive memory element and applying a voltage pulse to a second terminal of the transistor according to the voltage signal to write a reverse voltage to the resistive memory cell during a first time period and under the circumstance that the resistive memory cell fails to pass verification.

7. The resistive random access memory (RRAM) according to claim 6, wherein the reverse voltage progressively increases along with the progressive increase in a verification count of the resistive memory cell.

8. The resistive random access memory (RRAM) according to claim 6, wherein the reverse voltage progressively decreases along with the progressive increase in a verification count of the resistive memory cell.

9. The resistive random access memory (RRAM) according to claim 6, wherein the selection circuit applies the voltage pulse to the other terminal of the resistive memory element and applies a reference voltage to a second terminal of the transistor according to the voltage signal to write the forward voltage to the resistive memory cell during a second time period different from the first time period and under the circumstance that the resistive memory cell fails to pass verification.

10. The resistive random access memory (RRAM) according to claim 9, wherein the forward voltage progressively increases along with the progressive increase in a verification count of the resistive memory cell.

* * * * *